US011508880B2

(12) United States Patent
Treadway et al.

(10) Patent No.: US 11,508,880 B2
(45) Date of Patent: Nov. 22, 2022

(54) STRUCTURE, METHODS FOR PRODUCING A STRUCTURE AND OPTOELECTRONIC DEVICE

(71) Applicant: OSRAM Opto Semiconductors GmbH, Regensburg (DE)

(72) Inventors: Joseph Treadway, Portland, OR (US); Erik Johansson, Portland, OR (US); Brian Theobald, Gladstone, OR (US)

(73) Assignee: TDK ELECTRONICS AG, Munich (DE)

(*) Notice: Subject to any disclaimer, the term of this patent is extended or adjusted under 35 U.S.C. 154(b) by 51 days.

(21) Appl. No.: 16/822,398

(22) Filed: Mar. 18, 2020

(65) Prior Publication Data
US 2021/0296542 A1 Sep. 23, 2021

(51) Int. Cl.
H01L 33/50 (2010.01)
H01L 33/00 (2010.01)

(52) U.S. Cl.
CPC .......... H01L 33/502 (2013.01); H01L 33/005 (2013.01)

(58) Field of Classification Search
CPC ......... H01L 33/502; H01L 2924/00014; H01L 2924/12041; H01L 2924/12044; H01L 2924/181; H01L 33/504; H01L 33/005; B82Y 20/00; B82Y 30/00
USPC .............. 136/256; 252/301.36, 500, 519.33, 252/33.008; 264/4.1; 438/22, 26, 478; 977/774
See application file for complete search history.

(56) References Cited

U.S. PATENT DOCUMENTS

| 8,021,449 | B2 | 9/2011 | Seth et al. | |
|---|---|---|---|---|
| 9,478,717 | B2* | 10/2016 | Mangum | H01L 33/56 |
| 2015/0285444 | A1* | 10/2015 | Choi | G02B 6/0053 252/301.4 F |
| 2017/0166807 | A1* | 6/2017 | Kuzumoto | C09K 11/025 |
| 2017/0167693 | A1* | 6/2017 | Yamazumi | C09K 11/08 |
| 2017/0352779 | A1* | 12/2017 | Kuzumoto | C08K 9/08 |
| 2019/0163016 | A1* | 5/2019 | Kim | H01L 33/50 |

FOREIGN PATENT DOCUMENTS

| EP | 3444846 A1 | 2/2019 |
|---|---|---|
| WO | 2018220161 A1 | 12/2018 |

OTHER PUBLICATIONS

Lawrence N. Amankwa, et al., "Trypsin-Modified Fused-Silica Capillary Microreactor for Peptide Mapping by Capillary Zone Electrophoresis," Analytical Chemistry, Jul. 15, 1992, vol. 64, pp. 1610-1613.

Correya, Adrine Antony et al., "Structural and optical characterization of hexagonal nanocrystal line bismuth-bismuth oxide core-shell structures synthesized at low temperature," Optik, Elsevier, Nov. 22, 2017, 6 pages.

(Continued)

Primary Examiner — Jonathan Han
(74) Attorney, Agent, or Firm — Slater Matsil, LLP

(57) ABSTRACT

A structure and a method for producing a structure are disclosed. In an embodiment a structure includes at least one semiconductor structure comprising at least one semiconductor nanocrystal and a high-density element for increasing a density of the structure, wherein a density of the high-density element is greater than a density of silica, and wherein the structure is configured to emit light.

17 Claims, 8 Drawing Sheets

(56) References Cited

OTHER PUBLICATIONS

Dai, Quanqin et al., "Semiconductor-Nanocrystals-Based White Light-Emitting Diodes," Small, vol. 6, No. 15, Jul. 2, 2010, 12 pages.
Ziegler, Jan et al., "Silica-Coated InP/ZnS Nanocrystals as Converter Material in White LEDs," Advanced Materials, vol. 20, No. 21, Nov. 3, 2008, 6 pages.

* cited by examiner

STRUCTURE, METHODS FOR PRODUCING A STRUCTURE AND OPTOELECTRONIC DEVICE

TECHNICAL FIELD

The invention relates to a structure. It further relates to methods of producing a structure and an optoelectronic device.

SUMMARY

Embodiments provide a structure with improved density. Further embodiments provide methods for producing a structure with improved density and an optoelectronic device comprising a structure with improved density.

According to at least one embodiment, a structure is provided. The structure can comprise different elements, components, or parts with specific, in particular different, properties.

According to at least one embodiment, the structure comprises at least one semiconductor structure. The structure may comprise exactly one semiconductor structure or exactly two semiconductor structures or a plurality of semiconductor structures, for example ten or more semiconductor structures.

Each semiconductor structure comprises at least one semiconductor nanocrystal. A semiconductor nanocrystal comprises at least a core and a shell. The core and/or the shell comprise at least one semiconductor material. In addition, a semiconductor nanocrystal can comprise further shells and/or layers.

The semiconductor structure may comprise exactly one semiconductor nanocrystal or exactly two semiconductor nanocrystals or a plurality of semiconductor nanocrystals, for example four or more semiconductor nanocrystals. In other words, a semiconductor structure consists of or comprises a semiconductor nanocrystal or an aggregate of at least two semiconductor nanocrystals. The semiconductor structure can comprise layers, for example, a passivation layer or a protection layer, or other elements, components, or parts bonded to or surrounding the semiconductor nanocrystal or the aggregate of semiconductor nanocrystals.

According to at least one embodiment, the structure comprises a high-density element for increasing a density of the structure. The density, i.e., the volumetric mass density or specific mass of an element is defined as its mass per unit volume. If not otherwise specified, "density" here and in the following means the average density of a structure or element with respect to all parts and elements of its composition. A structure with a high-density element has a higher density than the same structure without the high-density element. It should be noted that the high-density element not necessarily needs to be the densest element of the structure. In order to increase the overall density of the structure, the density of the high-density element needs to be higher than the average density of the other elements, components, and parts of the structure without the high-density element.

According to at least one embodiment, a density of the high-density element is greater than a density of silica, for example, of amorphous silica. Thus, the density of the high-density element is in particular greater than 2.7 g cm$^{-3}$.

According to at least one embodiment, the structure is configured to emit light. In particular, light here refers to electromagnetic radiation in a wavelength range between and including 350 nm to 1500 nm. The structure thus comprises at least one element, component, or part that emits light during operation of the structure. In particular, the structure is configured or designed to absorb incident electromagnetic radiation of a first wavelength range, a primary radiation, convert the primary radiation into electromagnetic radiation of a second wavelength range, a secondary radiation, and emit a secondary radiation. In other words, the structure may be or comprise at least one conversion material.

It is possible, that the structure is additionally configured or designed to convert the primary radiation into a secondary radiation of a third wavelength range. In this instance, the structure comprises two or more conversion materials.

According to at least one embodiment, the structure comprises at least one semiconductor structure comprising at least one semiconductor nanocrystal and a high-density element for increasing a density of the structure, wherein a density of the high-density particle is greater than a density of silica, and wherein the structure is configured to emit light.

A structure comprising a semiconductor structure and a high-density element has a higher average density than the semiconductor structure alone. This is advantageous for achieving sedimented semiconductor structures for light conversion in a matrix material. Sedimentation of conversion materials in light-emitting diodes brings about several beneficial improvements. It has been found that sedimented conversion materials make better thermal contact with the heat sink portions of a semiconductor chip or package which can improve operating life time and overall efficiency of the device. Color-over-angle properties can also be improved by sedimentation. In some cases, more reproducible manufacturing processes result from sedimentation.

In all instances, the goal of sedimentation is to force the conversion materials to settle on to the semiconductor chip, or at least to enrich the conversion material content near the semiconductor chip through some gradation. Here, either thermal or forced sedimentation might be used. Thermal sedimentation involves warming the matrix material to a point where it becomes non-viscous, but below the final curing temperature. Relatively dense conversion materials settle by gravity in this non-viscous medium. With forced sedimentation, a centrifuge could be used to increase the force driving settling of the dense conversion materials.

Although semiconductor nanocrystals are quite dense as naked particles, they usually must be overcoated with lower-density passivating materials. Even in the absence of these passivation layers, semiconductor nanocrystals that are small compared to ceramic phosphors have a very high surface area which leads to a large solvent sphere being associated with the semiconductor nanocrystals. Such a solvent sphere increases the effective particle size and diminishes the effective density. Consequently, semiconductor nanocrystals and semiconductor structures have a lower effective density than ceramic phosphors. In mixed semiconductor nanocrystal-phosphor hybrid devices, therefore, sedimentation usually results in the separation of semiconductor nanocrystals and phosphor particles which can be disadvantageous.

With the structure described herein comprising a semiconductor structure and a high-density element, the average density of the semiconductor structures or semiconductor nanocrystals can be increased to allow comparable sedimentation rates compared to phosphor particles. This results in the same heat sink advantages, improved color-over-angle properties and the full realization of efficacy gains that would be predicted from gains and luminous efficacy of radiation measurements. In addition, a retuning of colors in devices comprising only sedimented conversion materials compared to devices comprising only partially sedimented or unsedimented conversion materials is not necessary.

According to at least one embodiment, an average density per semiconductor nanocrystal of the structure is higher than an average density per semiconductor nanocrystal of the semiconductor structure. Thus, the high-density element increases the average density per semiconductor nanocrystal of the structure compared to the semiconductor structure without the high-density element.

According to at least one embodiment, the at least one semiconductor structure is bonded to a surface of a high-density particle. In this instance, the high-density particle is a high-density element. The high-density particle can be large compared to the semiconductor structure. The high-density particle can have a diameter of several µm. For example, the high-density particle can have a diameter in the range of 0.1 µm to 100 µm. In particular, a plurality of semiconductor structures can be bonded to the surface of one high-density particle. For example, at least ten semiconductor structures are bonded to the surface of one high-density particle. Bonding semiconductor structures to the surface of a high-density particle increases the average density of the structure and thus the settling rate in a matrix material.

According to at least one embodiment, the high-density particle is a luminescent phosphor particle or a non-emissive particle. The terms "luminescent" and "non-emissive" with respect to the high-density particles here and in the following refer to optical properties in the wavelength range from 350 nm to 1500 nm. Thus, for example, a non-emissive particle does not emit light in the visible wavelength range, but may have emissive properties in other wavelength ranges smaller than 350 nm or greater than 1500 nm. Luminescent phosphor particles and non-emissive particles can comprise or consist of a material that provides a useful mean of coupling to semiconductor structures. In particular, for semiconductor structures coated with metal oxides for passivation, metal-O-metal bonds can be formed between the high-density particle and the semiconductor structure enabling a particularly strong covalent bond.

Luminescent phosphor particles are, for example, metal nitrides, oxynitrides or activated garnets. Semiconductor structures bonded to the surface of luminescent phosphor particles result in structures comprising two, in particular different, wavelength converters, while at the same time increasing the average density of the structure. In particular, the semiconductor nanocrystals and the semiconductor structure can be configured or designed in such a way that they do not appreciably absorb green or red light. Thus, very high amounts of semiconductor structures can be attached to phosphors without resulting in excessive trivial energy transfer from green or red light to the semiconductor structure. This is advantageous because it results in higher external quantum efficiencies as high-energy light is not passed through phosphors to other emitters in highly absorbing layers.

Non-emissive particles are, for example, bismuth silicate particles, un-activated nitrides or un-activated garnets. Crystalline bismuth silicate, for example, $B_{12}SiO_{20}$ has a bulk density of 9.2 $gcm^{-3}$, wherein crystalline $SiO_2$ has a bulk density of 2.7 $gcm^{-3}$. Semiconductor structures bonded to non-emissive particles benefit from the increased density of the high-density particle but are not associated with another color of emission. Thus, these structures can be more flexible reagents in fine-tuning color properties.

According to at least one embodiment, the at least one semiconductor structure is bonded to the surface of the high-density particle with inorganic linkers, organic linkers or non-covalent linking. In other words, a linker is used to bond a semiconductor structure to the high-density particles. The linker is arranged between the surface of the high-density particle and the surface of the semiconductor structure. The linker is thus present in the interface between the high-density particle and the semiconductor structure. The chemical composition of the interface can be tuned by the properties of the linker. This opens the door to straight engineering, corrosion control, and control over electronic communication between, for example, phosphor particles and semiconductor nanocrystals. The linker can, for instance, affect water transport through the optional oxide barrier layers of the semiconductor structure as well as local dielectric properties of the surface materials.

Inorganic linkers result in a thin, inorganic interface. In particular, inorganic linkers form covalent bonds between the semiconductor structure and the high-density particle. Thus, inorganic linkers are covalently linking the particles together. Inorganic linkers are, for example, alkyl silicates like tetramethylorthosilicate, aluminum nitrate $AlNO_3$, and calcium nitrate $Ca(NO_3)_2$. Inorganic linkers form a thin, inorganic interface comprising, for example, silicate, aluminate, or calcium silicate hydrate. Thin, inorganic interfaces are chosen to minimize inter-particle distance and provide an inorganic barrier with distinct water transport and corrosion and dissolution limiting properties.

Alternatively, a thin, inorganic interface can be obtained by using di- or tri-valent ions for linking the high-density particles and the semiconductor structures. This will create a tight binding of semiconductor structures and high-density particles using a linker with controllable hydration.

Organic linkers result in a thick, organic interface. In particular, organic linkers form covalent bonds between the semiconductor structure and the high-density particle. Thus, organic linkers are covalently linking the particles together. Organic linkers are, for example, long bifunctional alkyl chains. Organic linkers form a thick, organic interface comprising, for example, 1,2-bis(triethoxysilyl)ethane. Organic linkers are chosen to maximize inter-particle distance and include an organic barrier that relies on different chemical principles to limit oxygen and water transport and thus corrosion and dissolution of semiconductor structures and/or luminescent phosphor particles if present.

Non-covalent linking forms less-than-covalent attachments between the semiconductor structure and the high-density particle. In other words, one linker is, in particular covalently, bonded to the surface of the semiconductor structure and another linker is, in particular covalently, bonded to the surface of the high-density particle. The linking of the semiconductor structure and the high-density particle then takes place by a non-covalent interaction between the two linkers bonded to the surface of the respective particles.

For instance, both the semiconductor structure as well as the high-density particle are hydrophobically modified and coalesce through concentration. The binding motif is here provided by van der Waals interactions between alkyl chains. In this case, suitable linkers are, for example, organochlorosilanes such as chloro(dimethyl)octylsilane or trimethoxysilanes. Similarly modified hydrophobic particles can also be bridged via surfactant mediated means, for example, couplings through tetrabutylammoinium halides. These less-than-covalent interactions can provide additional advantages as they are easily reversible and serve to relax stress and strain within the composite particles. With non-covalent linking, a more easily controlled ratio of semiconductor structures to high-density particles can be achieved.

In particular, "coalesce through concentration" means that both the semiconductor structures and the high-density particles are dissolved in a solvent. As the solvent is removed, for example, via evaporation, the concentration of the semiconductor structure and the high-density particles increases. Since both the semiconductor structure and the high-density particles are coated with chemical moieties that favor interacting with each other, they can begin to associate closely as their respective concentrations increase. This may happen though interdigitation of their ligands, sort of like the clasping of hands by interlacing fingers.

According to at least one embodiment, each semiconductor nanocrystal comprises an individual first layer surrounding semiconductor nanocrystal. Here and in the following, a layer directly or indirectly surrounding an individual semiconductor nanocrystal is referred to as a first layer. The first layer surrounds the semiconductor nanocrystal at least partially, preferably completely. In other words, the first layer can encapsulate or encase the semiconductor nanocrystal. In particular, the first layer is in direct mechanical contact to the surface of the semiconductor nanocrystal. The first layer can be configured or designed as a passivation layer for electronic passivation of the surface of the semiconductor nanocrystal. Alternatively or additionally, the first layer can be configured or designed as a protection layer for protecting the semiconductor nanocrystal against degradation due to, for example, harmful gases, air or moisture. Alternatively or additionally, the first layer can be configured as a high-density element for increasing the density of the structure.

According to at least one embodiment, the first layer comprises silica or a high-density oxide. The high-density oxide is in particular an oxide that has a higher density than silica. The high-density oxide is, for example, selected from bismuth oxide, bismuth silicate, tin oxide, barium oxide, tungsten oxide or combinations thereof. A first layer comprising silica can be coupled especially well to high-density particles through the formation of metal-O-metal bonds, in particular Si—O—Si bonds or Al—O—Si bonds.

A first layer comprising a high-density oxide is a high-density element for increasing the average density of the structure. A semiconductor nanocrystal encapsulated in a high-density oxide results in a structure of high-density that is compatible with thermal and centrifugal sedimentation techniques. Although the high-density oxide may have a lower density than the semiconductor nanocrystal, encapsulating the semiconductor nanocrystal in a high-density oxide results in a structure with a higher average density than a semiconductor nanocrystal encapsulated in silica.

According to at least one embodiment, the first layer comprises at least two regions. In other words, the first layer may be configured or designed as a two- or multi-layered structure. Each layer of the two- or multi-layered structure may be referred to as a sublayer of the first layer. The sublayers of the first layer can comprise the same material or different materials. For example, one sublayer can comprise silica and another sublayer can comprise a high-density oxide. It is also possible that the sublayers comprise different high-density oxides. With a first layer comprising at least two regions, a more targeted design of the structure can be achieved.

According to at least one embodiment, the first layer comprises a high-density oxide and a thickness of the first layer is greater than 0 nm and smaller than or equal to 100 nm. Increasing the thickness of the first layer comprising a high-density oxide increases the average density of the structure. At the same time, the absorptivity of the first layer can increase as more material of the second layer is deposited around the semiconductor nanocrystals.

In one embodiments, it is particularly important that the high-density oxide is non-absorptive or very little absorptive in the target wavelength ranges of the intended application. For semiconductor nanocrystals configured to convert radiation in the visible wavelength range, a high-density oxide that is non-absorptive or very little absorptive in the visible wavelength range such as bismuth silicate oxide can be used. For IR-applications, the absorptivity of the high-density oxide in the visible wavelength range is less relevant compared to the absorptivity in the IR wavelength range.

According to at least one embodiment, at least two semiconductor nanocrystals each comprising the first layer are aggregated and surrounded by a second layer. Here and in the following, a layer surrounding an aggregate of at least two semiconductor nanocrystals is referred to as a second layer. The second layer surrounds the encapsulated and aggregated semiconductor nanocrystals at least partially, preferably completely. In other words, the second layer can encapsulate or encase the encapsulated and aggregated semiconductor nanocrystals. In particular, the second layer is in direct mechanical contact to the individual first layers of the semiconductor nanocrystals. The second layer can be configured or designed as further passivation layer or a further protection layer or a high-density element.

According to at least one embodiment, at least two semiconductor nanocrystals each comprising the first layer are surrounded by a second layer, wherein the first layers of the semiconductor nanocrystals are not in direct mechanical contact to one another. In other words, the semiconductor nanocrystals comprising first layers are held together by the second layer without the first layers of the semiconductor nanocrystals touching directly. Thus, the semiconductor nanocrystals are aggregated by encapsulation in the second layer.

Alternatively, the semiconductor nanocrystals comprising first layers are aggregated with the first layers touching directly and surrounded with the second layer.

According to at least one embodiment, the second layer comprises silica or a high-density oxide. The high-density oxide is in particular an oxide that has a higher density than silica. The high-density oxide is, for example, selected from bismuth oxide, bismuth silicate, tin oxide, barium oxide, tungsten oxide or combinations thereof.

A second layer comprising silica can be coupled especially well to high-density particles through the formation of metal-O—Si bonds, in particular Si—O—Si bonds or Al—O—Si bonds.

A second layer comprising a high-density oxide is a high-density element for increasing the average density of the structure. And aggregate encapsulated in a high-density oxide results in a structure of high-density that is compatible with thermal and centrifugal sedimentation techniques.

According to at least one embodiment, the semiconductor nanocrystals in an aggregate comprise the first layer, wherein the first layer comprises at least two regions. In other words, the semiconductor nanocrystals can be individually surrounded by at least two regions or layers comprising the same or different materials prior to aggregation. For example, semiconductor nanocrystals can be individually encapsulated in silica and a high-density oxide and further aggregated and encapsulated in a high-density oxide. Thus, the semiconductor nanocrystals comprise a first layer comprising two regions and one second layer.

According to at least one embodiment, the second layer comprises at least two regions. In other words, the second layer may be configured or designed as a two- or multi-layered structure. Each layer of the two- or multi-layered structure may be referred to as a sublayer of the second layer. The sublayers of the second layer can comprise the same material or different materials. For example, one sublayer can comprise silica and another sublayer can comprise a high-density oxide. It is also possible that the sublayers comprise different high-density oxides. With a second layer comprising at least two regions, a more targeted design of the structure can be achieved.

According to at least one embodiment, the second layer comprises a high-density oxide and a thickness of the second layer is greater than 0 nm and smaller than or equal to 100 nm. Increasing the thickness of the second layer comprising a high-density oxide increases the average density of the structure. At the same time, the absorptivity of the second layer can increase as more material of the second layer is deposited around the semiconductor nanocrystals.

According to at least one embodiment, the first layer comprises a high-density oxide and the first layer is in direct contact to the semiconductor nanocrystal. In this instance, the first layer is a high-density element. Thus, a structure with an increased average density can be obtained.

According to at least one embodiment, the second layer comprises a high-density oxide and the second layer is in direct contact to the first layers. In this instance, the second layer is a high-density element. Thus, a structure with an increased average density can be obtained.

According to at least one embodiment, the structure comprises at least two high-density elements. In particular, any of the high-density elements described above can be used in any combination with each other in one structure. For example, a semiconductor structure is surrounded with a high-density layer and bonded to a high-density particle. Alternatively or additionally, a semiconductor structure can be surrounded with two or more high-density layers.

Another embodiment relates to a method for producing a structure. The method described here is preferably used to produce the structure described here. Features and embodiments of the method are therefore also disclosed for the structure and vice versa.

According to at least one embodiment, the method for producing a structure comprises the steps
functionalizing a surface of the high-density particle and/or a semiconductor structure comprising at least one semiconductor nanocrystal, in particular with bifunctional chemical linkers;
bonding semiconductor structures each comprising at least one semiconductor nanocrystal to the functionalized high-density particle or bonding a high-density particle to the functionalized semiconductor structure or bonding the functionalized semiconductor structure to the functionalized high-density particle;
wherein a density of the high-density particle is greater than a density of silica, and
wherein the structure is configured to emit light.

The method steps for producing a structure described here are not restricted to this order. According to a preferred embodiment, however, they are carried out in this order.

The surface of the high-density particle or the semiconductor structure can be functionalized by bonding coupling reagents to the surface or modifying the surface structure. In both instances, a high-density particle or a semiconductor structure can be bonded to the coupling reagent or the modified surface of the functionalized high-density particle or the functionalized semiconductor structure.

Coupling reagents are, for example, bifunctional chemical linkers such as organic or inorganic molecules that are bonded to the surface of the functionalized high-density particle or semiconductor structure via one functional group. The other functional group of the bifunctional chemical linkers can then be bonded to the surface of a non-functionalized high-density particle or to the surface of a non-functionalized semiconductor structure. Alternatively, for hydrophobically modified linkers, the binding motif is provided by van der Waals interactions between linkers of functionalized high-density particle and functionalized semiconductor structures.

Functionalizing the surface of the high-density particle and/or the semiconductor structure by modifying the surface structure can be achieved by surface preparation steps. For example, a re-hydroxylation is used to generate reactive —OH functionalities on the surfaces of either the high-density particle and/or the semiconductor structure. In particular, the acidity of surface groups or the stability or surficial metal-O-metal bonds will vary with the identity of the metal. Thus, in some instances, a surface preparation of both the high-density particles and the semiconductor structures may be needed and, in other instances, it may be sufficient to only functionalize only the surface of the high-density particles or the semiconductor structures. In particular, both the surfaces of the high-density particles and the semiconductor structures are functionalized.

In particular, the sequential method described here and a careful control of reactant and reagent amounts prevents the formation of large aggregates of semiconductor structures that are not bound to a high-density particle.

Bonding high-density particles to semiconductor structures or bonding semiconductor structures to high-density particles results in the formation of a structure with a higher average density which is advantageous for a sedimentation of wavelength converters in conversion elements.

Another embodiment relates to a method for producing a structure. The method described here is preferably used to produce the structure described here. Features and embodiments of the method are therefore also disclosed for the structure and vice versa.

According to at least one embodiment, the method for producing a structure comprises the steps;
providing a semiconductor nanocrystal or a semiconductor structure comprising at least one semiconductor nanocrystal;
surrounding the semiconductor nanocrystal or the semiconductor structure with a high-density oxide layer, wherein a density of the high-density particle is greater than a density of silica; and
wherein the structure is configured to emit light.

The method steps for producing a structure described here are not restricted to this order. According to a preferred embodiment, however, they are carried out in this order.

The method steps of surrounding the semiconductor nanocrystal or the semiconductor structure with a high-density oxide layer can be referred to as a surrounding reaction or shelling reaction configured to encapsulate or encase the semiconductor nanocrystal or the semiconductor structure in a high-density oxide layer.

In particular, the high-density oxide layer either encapsulates a semiconductor nanocrystal, or a semiconductor structure comprising at least one semiconductor nanocrystal optionally encapsulated in a first layer and/or aggregated with further semiconductor nanocrystals. It is also possible, that the semiconductor structure comprises at least two semiconductor nanocrystals individually encapsulated in a first layer, aggregated and encapsulated by a second layer. In this instance, the high-density oxide layer surrounds the second layer.

In particular, before or during surrounding the semiconductor nanocrystal or the semiconductor structure, the high-density oxide layer can be sintered at high temperatures. Sintering temperatures are, for example, between and including 500° C. and 2500° C. Sintering can make the high-density oxide layer more crystalline and thus denser. In particular, during sintering, voids can be formed in the high-density oxide layer that can act as scattering centers for light. Since semiconductor nanocrystals can be sensitive to high temperature, surrounding semiconductor nanocrystals at low temperature may be preferable. For semiconductor structures comprising encapsulated semiconductor nanocrystals, sintering during surrounding with the high-density oxide layer may be beneficial to get a denser high-density oxide layer without damaging the semiconductor nanocrystals.

Alternatively, the high-density oxide can be sintered separately from the semiconductor structure and then attached to the semiconductor particle. In this instance, the high density oxide can be sintered at a high temperature, while avoiding exposing the semiconductor structure to high temperature.

Surrounding the semiconductor nanocrystal or the semiconductor structure with a high-density oxide layer results in the formation of a structure with an increased average density which is advantageous for a sedimentation of wavelength converters in conversion elements.

According to at least one embodiment, surrounding the semiconductor nanocrystal or the semiconductor structure with a high-density oxide layer comprises adding a high-density oxide reagent at the beginning of the surrounding or shelling reaction and adding additional high-density oxide reagent one or more additional times throughout the surrounding or shelling reaction. In particular, a syringe pump can be used to increase the overall amount of high-density oxide reagent, but the dispensing is performed slowly during the reaction time. Upon initiation of growth of a high-density oxide layer, the final size of the high-density oxide layer can be controlled by the amount of high-density oxide reagent and injection method. When growing layers thicker than approximately 30 nm, it may be critical to control the amount and rate of reagents entering into the reaction mixture to avoid forming free high-density oxide particles.

According to at least one embodiment, a thickness of the high-density oxide layer is greater than 0 nm and smaller than or equal to 100 nm. In particular, the thickness of the high-density oxide layer can be controlled approximately in a range of 0 to 100 nm total diameter with a delta of approximately 5 nm.

According to at least one embodiment, the method further comprises aggregating the at least two semiconductor nanocrystals surrounded with the high-density oxide layer, and surrounding the aggregate with a further layer. In other words, the structure comprises high-density oxide layers around semiconductor nanocrystals surrounded or encapsulated with a second layer. The aggregated semiconductor nanocrystals are not necessarily in direct contact with one another. In particular, at least two semiconductor nanocrystals individually surrounded with a high-density oxide layer are encapsulated with the further layer in such a way that they are held together by the further layer but are not in direct mechanical contact to one another.

The further layer may comprise a metal oxide such as silica. In particular, the density of the metal oxide of the further layer may be smaller than the density of the high-density oxide layer.

Another embodiment relates to an optoelectronic device. Preferably, the optoelectronic device described here comprises at least one structure described above produced with one of the methods described above. Features and embodiments of the optoelectronic device are therefore also disclosed for the structure and the methods and vice versa.

According to at least one embodiment, the optoelectronic device comprises a semiconductor chip configured to emit a primary radiation, and a conversion element configured to convert at least part of the primary radiation into secondary radiation, wherein the conversion element comprises at least one structure described above.

The semiconductor chip can comprise an active layer stack comprising an active region that emits the primary radiation during operation of the device. The semiconductor chip is, for example, a light-emitting diode chip or a laser diode chip. The primary radiation generated in the semiconductor chip can be emitted through a radiation emission surface of the semiconductor chip. In particular, the semiconductor chip emits a primary radiation in the visible wavelength range during operation, preferably with wavelengths greater than 300 nm. For example, the semiconductor chip emits the primary radiation in the wavelength range from 300 nm inclusive to 800 nm inclusive.

The structures in the conversion element are configured to convert the primary radiation at least partially or completely into a secondary radiation. In particular, the secondary radiation has a wavelength range that is at least partially, preferably completely, different from the wavelength range of the primary radiation. For example, the wavelength range of the secondary radiation is in the visible or IR wavelength range, for example, in a range from 500 to 1500 nm.

The features of the structure have already been disclosed in conjunction with the structure and the methods for producing the structure and also apply to the structures in the optoelectronic device.

Such an optoelectronic device can be used for emitting white light or colored light. The structures can be sedimented in the conversion element more easily as they comprise a high-density element. Thus, the operating lifetime, the color-over-angle properties as well as the overall efficiency of the optoelectronic device can be improved by enriching the converter content near the semiconductor chip or even forcing the converters to settle onto the semiconductor chip. Additionally, an improved sedimentation results in more reproducible manufacturing processes for producing optoelectronic devices.

According to at least one embodiment, the conversion element comprises a single layer of matrix material and at least two wavelength converting compounds with different energy emissions arranged in layers in the single layer of matrix material, wherein the wavelength converting compounds are arranged in order of their energy emission, wherein the wavelength converting compound with the lowest energy emission is arranged closest to the semiconductor chip, and wherein at least one of the wavelength converting compounds comprises the structure described above.

In other words, the wavelength converting compound with the lowest energy emission is arranged on or in close vicinity to the semiconductor chip and the energy emission of the further wavelength converting compounds present in the single layer of matrix material is increasing with increasing distance to the semiconductor chip. In terms of color, the wavelength converting compounds are arranged from the reddest emitting compound arranged closest to the semiconductor chip to the bluest emitting compound arranged farthest from the semiconductor chip. Such an arrangement minimizes the energy losses stemming from reabsorption of shorter wavelength light emitted by one wavelength converting compound by a longer wavelength emitting wavelength converting compound, thus improving the light management and enhancing the brightness and the conversion efficiency of the optoelectronic device.

The layering can be achieved by controlling the average density and thus the settling rates of the wavelength converting compounds.

It should be noted that semiconductor nanocrystals can emit a wide variety of wavelength ranges or colors. Thus, the structure comprising at least one semiconductor nanocrystal is not necessarily arranged closest to the semiconductor chip. In other words, the structure can be arranged in any layer of wavelength converting compounds in the single layer of matrix material. This is facilitated by the structure comprising a high-density element as the average density or effective density of the structure can be adjusted. Alternatively or additionally, the average density of the further wavelength converting compounds can be lowered by functionalizing their surfaces with alkyl and/or silane chains of different lengths and branching ratios. During either thermal or forced sedimentation, dense wavelength converting compounds have a higher settling rate than less dense wavelength converting compounds.

According to at least one embodiment, the conversion element comprises a single layer of matrix material, a plurality of structures in the single layer of matrix material, a green phosphor in the single layer of matrix material, and a red phosphor in the single layer of matrix material, wherein the plurality of structures is arranged adjacent to the semiconductor chip, the red phosphor is arranged adjacent to the plurality of structures, and the green phosphor is arranged adjacent to the red phosphor.

In this instance, the structure can be the wavelength converting compound with the reddest emission in order to minimize energy losses due to reabsorption. This can be achieved by synthesizing structures of maximum density. Additionally, the average density of the red and green phosphors can be lowered by functionalizing their surface.

According to at least one embodiment, the structure comprises semiconductor structures bonded to the surface of a high-density particle, wherein the high-density particle is a luminescent phosphor particle. In this instance, the structure can be a wavelength converting compound that comprises two conversion materials. Each conversion material can be configured to convert primary radiation into radiation of a different wavelength range. In particular, the semiconductor nanocrystals convert the primary radiation into a secondary radiation of one wavelength range and the luminescent phosphor particle converts the primary radiation into a secondary radiation of another wavelength range. Thus, the optoelectronic device can be configured to emit white light with only one wavelength converting compound in the conversion element.

BRIEF DESCRIPTION OF THE DRAWINGS

Advantageous embodiments and developments of the conversion layer, the light-emitting device, and the method of producing a light-emitting device will become apparent from the exemplary embodiments described below in conjunction with the figures.

In the figures.

In the exemplary embodiments and figures, similar or similarly acting constituent parts are provided with the same reference symbols. The elements illustrated in the figures and their size relationships among one another should not be regarded as true to scale. Rather, individual elements may be represented with an exaggerated size for the sake of better representability and/or for the sake of better understanding.

DETAILED DESCRIPTION OF ILLUSTRATIVE EMBODIMENTS

Figure 1A:
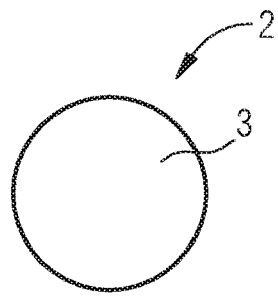
FIGS. 1A-C each shows a schematic illustration of a semiconductor structure according to different embodiments of the structure.
Figure 1B:
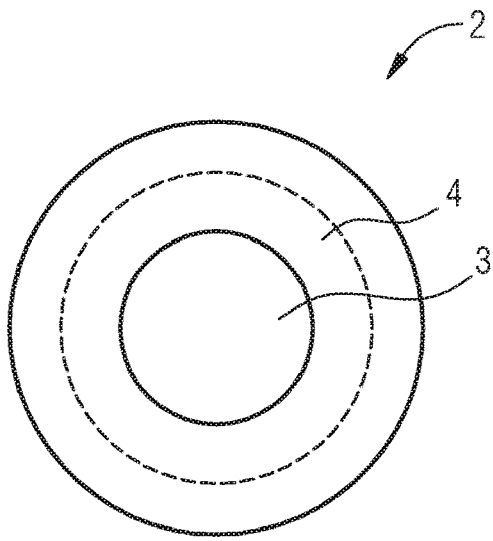
Figure 1C:
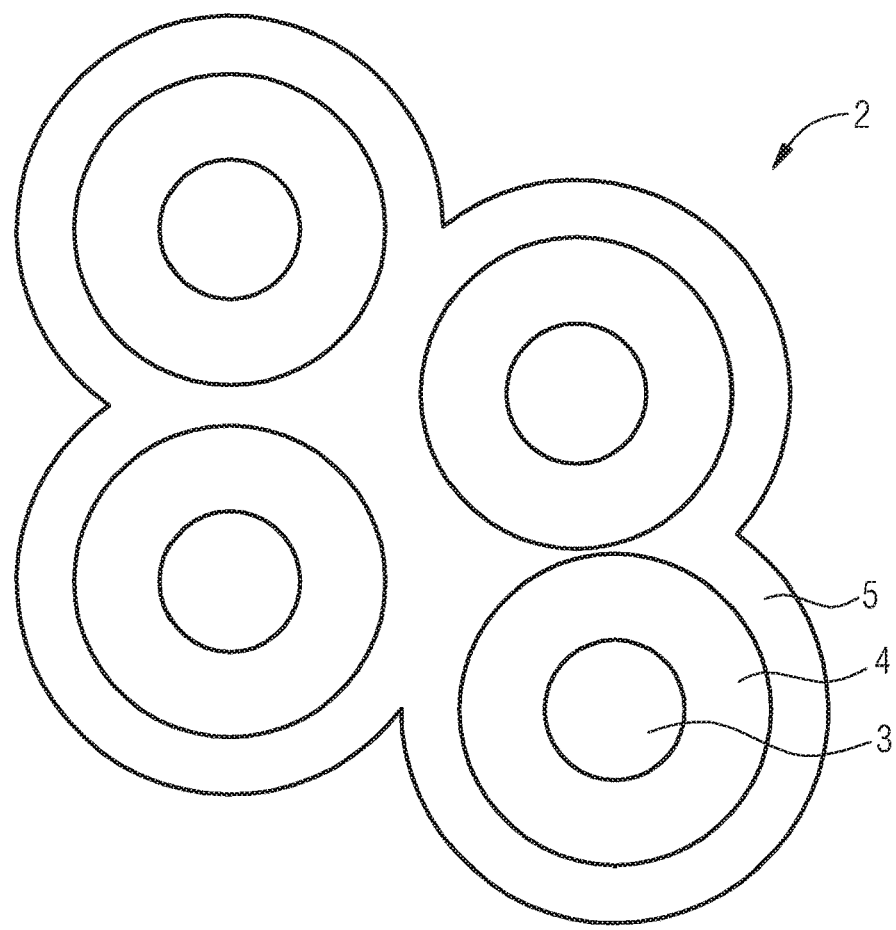

The FIGS. 1A-C each shows a schematic illustration of a semiconductor structure 2.

The semiconductor structure 2 in FIG. 1A comprises a semiconductor nanocrystal 3. The semiconductor nanocrystal 3 comprises a core and at least one shell surrounding the core. The semiconductor nanocrystal 3 can optionally comprise further shells and layers.

The semiconductor structure 2 in FIG. 1B comprises a semiconductor nanocrystal 3 surrounded with a first layer 4. The first layer 4 surrounds the semiconductor nanocrystal 3 at least partially, preferably completely. In other words, the first layer 4 encapsulates or encases the semiconductor nanocrystal 3. In particular, the first layer 4 is in direct mechanical contact to the semiconductor nanocrystal 3. The first layer 4 comprises a metal oxide, for example silica. As indicated by the dashed line in FIG. 1B, the first layer 4 may comprise at least two regions comprising the same or a different material.

The semiconductor structure 2 in FIG. 1C differs from the semiconductor structure 2 in FIG. 1B in that at least two semiconductor nanocrystals 3 each individuality encapsulated in the first layer 4 are aggregated and surrounded with a second layer 5. In other words, the second layer 5 encapsulates or encases the individually encapsulated semiconductor nanocrystals 3. In particular, the second layer 5 is in direct mechanical contact to the first layers 4 of the semiconductor nanocrystals 3. In particular, the first layers 4 of the semiconductor nanocrystals 3 are not in direct mechanical contact to one another. In other words, the semiconductor nanocrystals 3 comprising first layers 4 are held together by the second layer 5 without the first layers 4 of the semiconductor nanocrystals 3 touching directly. Thus, the semiconductor nanocrystals 3 are aggregated by encapsulation in the second layer 5. The second layer 5 comprises a metal oxide, for example silica. The second layer 5 may comprise the same or a different material than the first layers 4. The second layer 5 may comprise at least two regions comprising the same or a different material (not shown here).

Alternatively, the semiconductor nanocrystals 3 comprising first layers 4 are aggregated with the first layers 4 touching directly and surrounded with the second layer 5.

Figure 2:
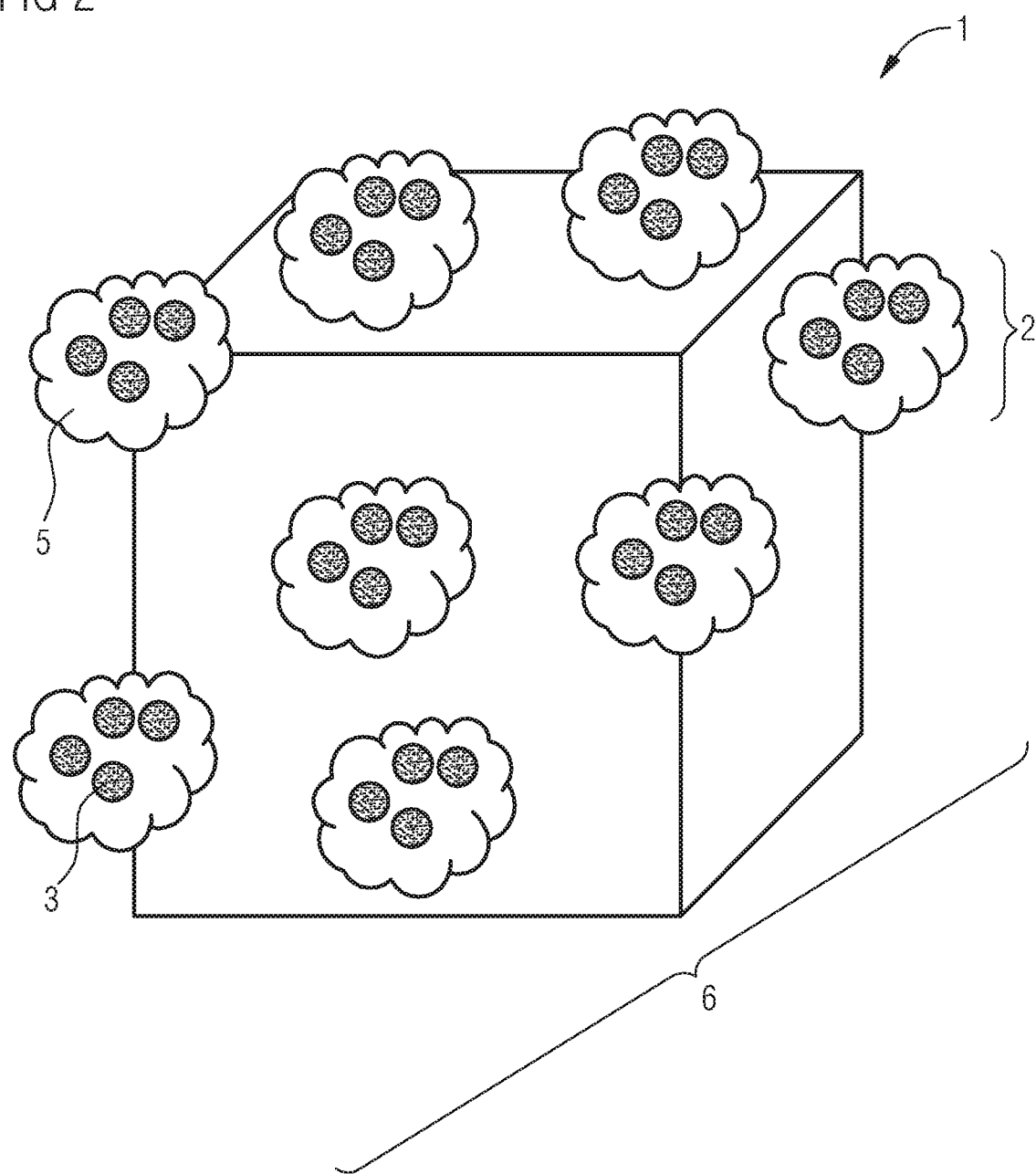
FIG. 2 shows a schematic illustration of a structure according to one embodiment.

FIG. 2 shows a schematic illustration of a structure 1. The structure 1 comprises a plurality of semiconductor structures 2 bonded to the surface of a high-density particle 6. In this instance, the semiconductor structures 2 are semiconductor structures 2 as shown in FIG. 1C. It is also possible, that the semiconductor structures 2 as shown in FIGS. 1A and 1B are bonded to the surface of a high-density particle 6. In particular, the semiconductor nanocrystals 3 are passivated with a first layer 4 and/or a second layer 5 is shown in FIGS. 1B and 1C for facilitating the bonding to the high-density particle and for protecting the semiconductor nanocrystals 3 from degradation.

A structure 1 comprising semiconductor structures 2 bonded to high-density particles 6 may have a higher average density per semiconductor nanocrystal 3 than the average density per semiconductor nanocrystal 3 of the semiconductor structure 2.

The high-density particle 6 is a relatively large particle compared to the semiconductor structures 2. Thus, a plurality of semiconductor structures 2 can be bonded to the surface of the high-density particle 6. The high-density particle 6 can be a luminescent phosphor particle such as activated metal nitrides, activated metal oxynitrides or activated garnets. Alternatively, the high-density particle 6 can be a non-emissive particle such as bismuth silicate particles, un-activated nitrides or un-activated garnets. For example, crystalline $Bi_{12}SiO_{20}$ can be used. Crystalline $Bi_{12}SiO_{20}$ with a bulk density of 90.2 g $cm^{-3}$ is significantly denser than, for example, crystalline $SiO_2$ with a bulk density of 2.7 g $cm^{-3}$. All these materials provide a useful mean of coupling to semiconductor structures comprising an outer layer of silica through the formation of Si—O—Si or Al—O—Si or other metal-O—Si bonds.

In particular, the semiconductor structure 2 can be configured or designed in such a way that it absorbs no or nearly no radiation in the green or red wavelength range. Thus, very high amounts of semiconductor structures 2 can be attached to luminescent red or green phosphor particles without resulting in excessive trivial energy transfer to the semiconductor structure 2.

Semiconductor structures 2 bonded to non-emissive particles benefit from the increased density of the high-density particle 6 but are not associated with another color of the emitter. These adducts might be more flexible reagents in fine-tuning color properties.

For bonding a high-density particle 6 and a semiconductor structure 2, the surfaces of the high-density particle 6 and/or the semiconductor structure 2 are functionalized. Functionalizing the surfaces can either be achieved by using coupling reagents or by modifying the surface structure.

Modifying the surface structure may require an additional surface preparation step. In particular, re-hydroxylation approaches can be used, for example, to generate reactive Si—OH functionalities on the surface of the high-density particle 6 such as garnets or on the silica surface of the semiconductor structure 2.

Alternatively, coupling reagents such as bifunctional chemical linkers can be used. The linker is used to bond the semiconductor structure 2 to the high-density particle 6.

Semiconductor structures 2 can be bonded to high-density particles 6 using bifunctional chemical linkers as follows:

A stirred solution of high-density particles 6 are chemically modified by addition of a second solution of bifunctional chemical linkers. At the completion of the reaction, a solution of linker-decorated high-density particles 6 is obtained, and only minimal amounts of linker exist freely in the solution. To this solution, a third solution of semiconductor structures 2 is added. The resulting product comprises high-density particle 6 decorated with semiconductor structures 2 as shown in FIG. 2. Importantly, the sequential method and the control of reactant and reagent amounts prevent the formation of large semiconductor structure aggregates that are not bonded to a high-density particle 6.

Alternatively, it is possible to functionalize the surface of the semiconductor structures 2 and subsequently add the high-density particles 6 to obtain high-density particle 6 decorated with semiconductor structures 2 as shown in FIG. 2.

Alternatively, it is possible to functionalize the surface of the semiconductor structures 2 and the surface of the high-density particles 6 separately and subsequently mix the functionalized high-density particles 6 with the functionalized semiconductor structures 2 in order to obtain high-density particle 6 decorated with semiconductor structures 2 as shown in FIG. 2.

Figure 3:
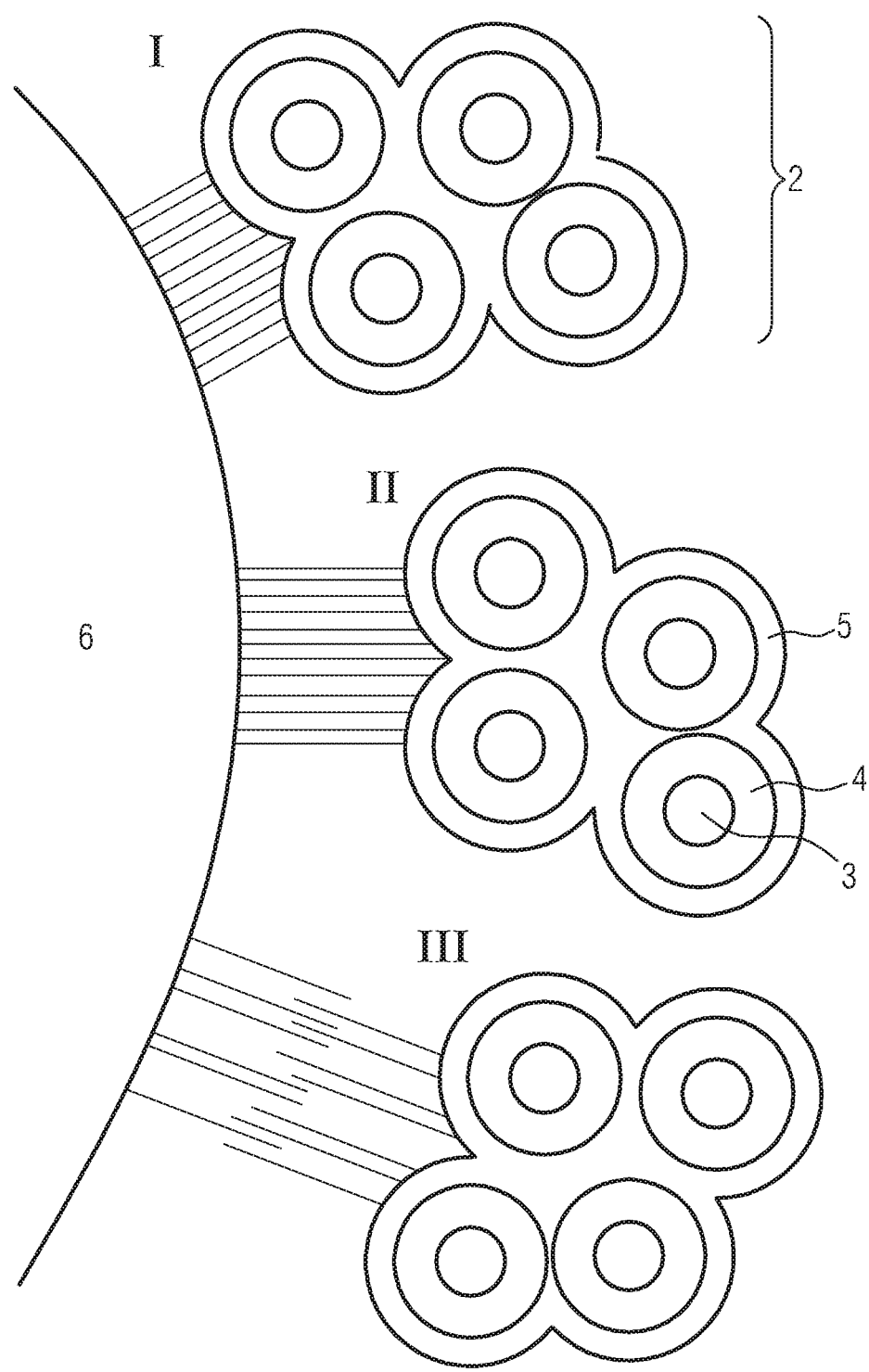
FIG. 3 shows schematic illustrations of different binding motifs according to different embodiments.

The properties of the bifunctional chemical linker affects the chemical composition and properties of the interface between the high-density particle 6 and the semiconductor structure 2. FIG. 3 shows three different binding motifs that result in different interfaces with different properties.

FIGS. 3I-III each show a semiconductor structure 2 comprising semiconductor nanocrystals 3 individually encapsulated by a first layer 4 aggregated and surrounded by a second layer 5. The semiconductor structures 2 are bonded to the surface of a high-density particle 6 using different linkers. The linkers in FIGS. 3I and 3II covalently bond the high-density particle 6 and the semiconductor structure 2, while the linkers in FIG. 3III form less-than-covalent attachments like van der Waals interactions between the high-density particle 6 and the semiconductor structure 2.

In FIG. 3I, inorganic linkers, for example, alkyl silicates like tetramethylorthosilicate, or aluminum nitrate $Al(NO_3)_3$, or calcium nitrate $Ca(NO_3)_2$ form a thin, inorganic interface comprising, for example, silicate, aluminate, or calcium silicate hydrate. Thin, inorganic interfaces are chosen to minimize inter-particle distance and provide an inorganic barrier with distinct water transport and corrosion and dissolution limiting properties.

Alternatively, a thin, inorganic interface can be obtained as follows:

A stirred solution of high-density particles, for example, phosphor particles or bismuth silicate particles are chemically modified by addition of a base to convert surface metal-OH to metal-$O^-$, for example, Si—$O^-$. A second solution of di- or trivalent ions such as $Ca^{2+}$ or $Al^{3+}$ is added to the first solution to decorate the high-density particle 6 with di- or trivalent ions. To this solution, the third solution of semiconductor structures 2 suspended in a basic aqueous media is added to form structures similar to that in FIG. 3I. This approach creates a tight binding of semiconductor structures 2 and high-density particle 6 using a linker with controllable hydration.

In FIG. 3II, organic linkers, for example, long bifunctional alkyl chains form a thick, organic interface comprising, for example, 1,2-bis(triethoxysilyl)ethane. Thick, organic interfaces are chosen to maximize inter-particle distance and include an organic barrier that relies on different chemical principles tournament oxygen and water transport and thus corrosion and dissolution of semiconductor structures 2 and high-density particle 6.

In FIG. 3III, non-covalent linking is shown. Non-covalent linking means less-than-covalent attachments between the semiconductor structure 2 and the high-density particle 6. In particular, the linkers are covalently bonded to the surface of the semiconductor structure 2 or the surface of the high-density particle 6.

The linkers can be hydrophobically modified alkyl silanes, for example, organochlorosilanes such as chloro(dimethyl)octylsilane or trimethoxysilanes, that are allowed to coalesce through concentration. The binding motif is provided by van der Waals interactions between alkyl chains. Alternatively, similarly modified hydrophobic semiconductor structures 2 and high-density particle 6 can be bridged via surfactant mediated means, for example, coupling through tetrabutylammonium halides.

Less-than-covalent attachments are easily reversible and serve to relax stress and strain within the composite particles and can result in a more easily controlled ratio of semiconductor structures 2 to high-density particles 6.

FIGS. 4A-E show different schematic illustration of a structure 1.

Figure 4A:
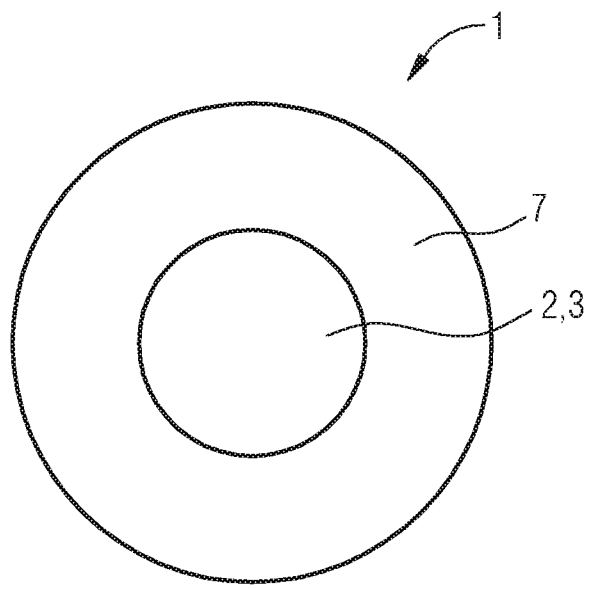
FIGS. 4A-F and 5 each show different schematic illustrations of a structure according to different embodiments.

The structure 1 in FIG. 4A comprises a semiconductor structure 2 comprising one semiconductor nanocrystals 3. The semiconductor nanocrystals 3 and thus the semiconductor structure 2 is surrounded with a high-density oxide layer 7. The high-density oxide layer 7 surrounds the semiconductor nanocrystal 3 at least partially, preferably completely. In particular, the high-density oxide layer 7 is in direct mechanical contact to the semiconductor nanocrystal 3. The high-density oxide layer 7 comprises a high-density oxide, for example, bismuth oxide, bismuth silicate, tin oxide, barium oxide, tungsten oxide or combinations thereof.

Figure 4B:
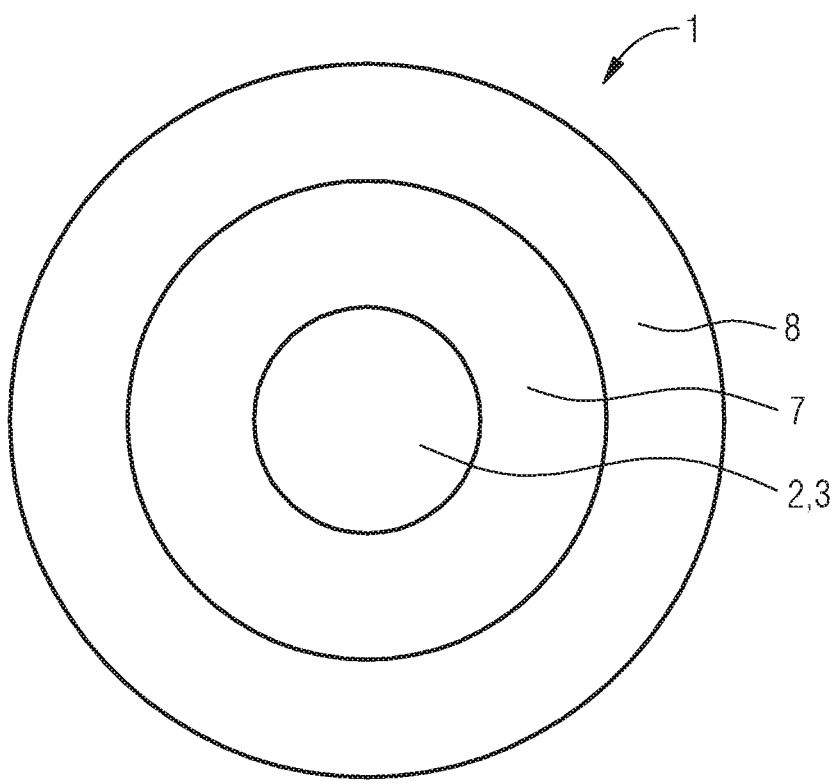

The structure 1 in FIG. 4B comprises the structure 1 from FIG. 4A with a further layer 8 surrounding at least partially, preferably completely, the high-density oxide layer 7. In particular, the further layer 8 is in direct mechanical contact to the high-density oxide layer 7. The further layer 8 comprises a metal oxide, for example, silica.

Figure 4C:
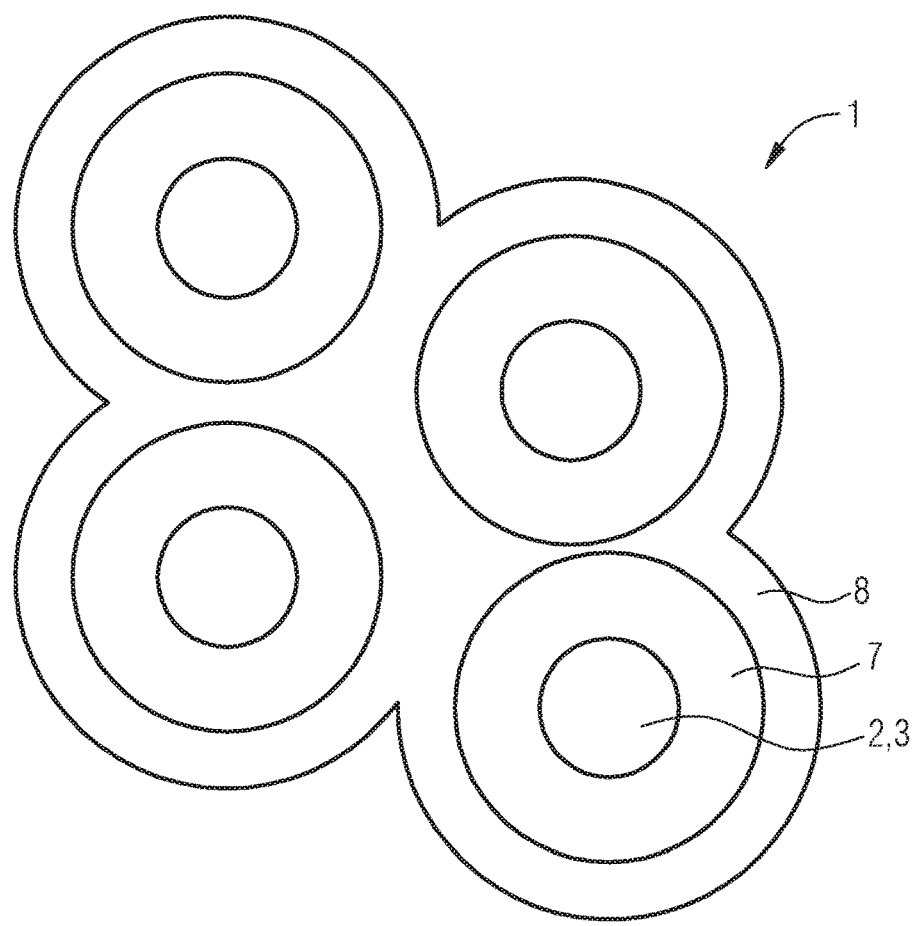

The structure 1 in FIG. 4C comprises a plurality of structures 1 from FIG. 4A that are aggregated and surrounded by a further layer 8. In particular, the plurality of structures 1 from FIG. 4A are held together by the further layer 8 without the high-density oxide layers 7 touching directly. Thus, the structures 1 from FIG. 4A are aggregated by encapsulation in the further layer 8.

Alternatively, the plurality of structures 1 from FIG. 4A are aggregated with the high-density oxide layers 7 touching directly and further surrounded with further layer 8.

The structures 1 according to FIG. 4A-C can be produced as follows:

A dispersion of pre-formed semiconductor nanocrystals 3 is combined with a bifunctional linker and with a micellar suspension of organic solvent, water, and surfactant. Addition of a high-density oxide reagent, for example, a silica and bismuth precursor such as tetraethyl orthosilicate and bismuth nitrate, and a catalyst, for example, aqueous base, initiates polymerization of the mixed metal oxide nucleated at the surface of the semiconductor nanocrystal 3. Structures 1 according to FIG. 4A can then be isolated.

Following the isolation of the structure 1 according to FIG. 4A, the structures 1 can be surrounded with a further layer 8 with a similar method as for surrounding the semiconductor nanocrystals 3 with a high-density oxide layer 7. Structures 1 according to FIG. 4B can then be isolated.

Alternatively, following the isolation of the structure 1 according to FIG. 4A, the structures 1 can be aggregated and re-polymerized into larger structures. In the re-polymerization step, further layer 8 is formed. During aggregation and re-polymerization, the plurality of structures 1 can be aggregated and surrounded with the further layer 8 either with the high-density oxide layers 7 of the structures 1 touching directly or without the high-density oxide layers 7 of the structures 1 touching directly. Structures 1 according to FIG. 4C can then be isolated.

Figure 4D:
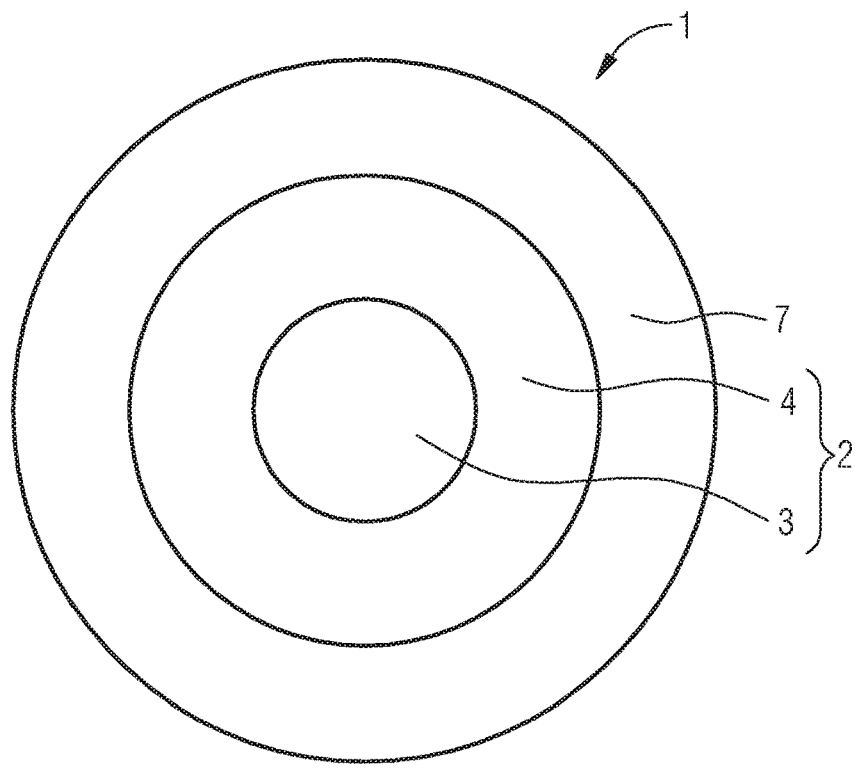

The structure 1 in FIG. 4D comprises a semiconductor structure 2 comprising a semiconductor nanocrystal 3 surrounded with a first layer 4. A high-density oxide layer 7 surrounds the first layer 4 at least partially, preferably completely. In particular, the high-density oxide layer 7 is in direct mechanical contact to the first layer 4.

The structures 1 according to FIG. 4D can be produced as follows:

A dispersion of pre-formed semiconductor structures 2 comprising a semiconductor nanocrystal 3 surrounded with the first layer 4 is combined with a bifunctional linker and with a micellar suspension of organic solvent, water, and surfactant. Addition of a high-density oxide reagent, for example, a silica and bismuth precursor such as tetraethyl orthosilicate and bismuth nitrate, and a catalyst, for example, aqueous base, initiates polymerization of the mixed metal oxide nucleated at the surface of the semiconductor structure 2. Structures 1 according to FIG. 4D can then be isolated.

Figure 4E:
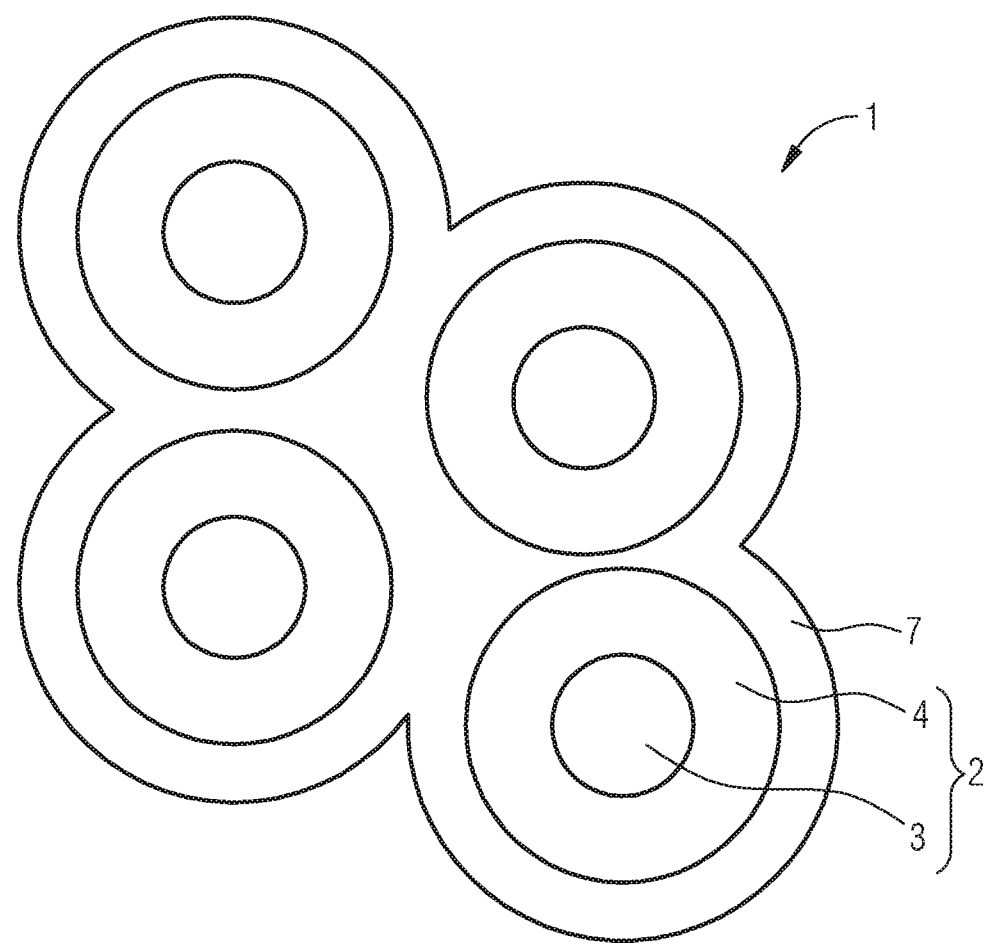

The structure 1 in FIG. 4E comprises a plurality of semiconductor structures 2 each comprising a semiconductor nanocrystal 3 surrounded with a first layer 4. The plurality of semiconductor structures 2 are aggregated and surrounded by a high-density oxide layer 7. In particular, the plurality of structures 1 from FIG. 4A are held together by the high-density oxide layer 7 without the first layers 4 touching directly. Thus, the structures 1 from FIG. 4A are aggregated by encapsulation in the high-density oxide layer 7.

Alternatively, the plurality of structures 1 from FIG. 4A are aggregated with the first layers 4 touching directly and surrounded with the high-density oxide layer 7.

The structures 1 according to FIG. 4E can be produced as follows:

A plurality of preformed semiconductor structures 2 can be aggregated and re-polymerized. In the re-polymerization step, the high-density oxide layer 7 is formed comprising, for example, bismuth silicate. Structures 1 according to FIG. 4E can then be isolated.

Figure 4F:
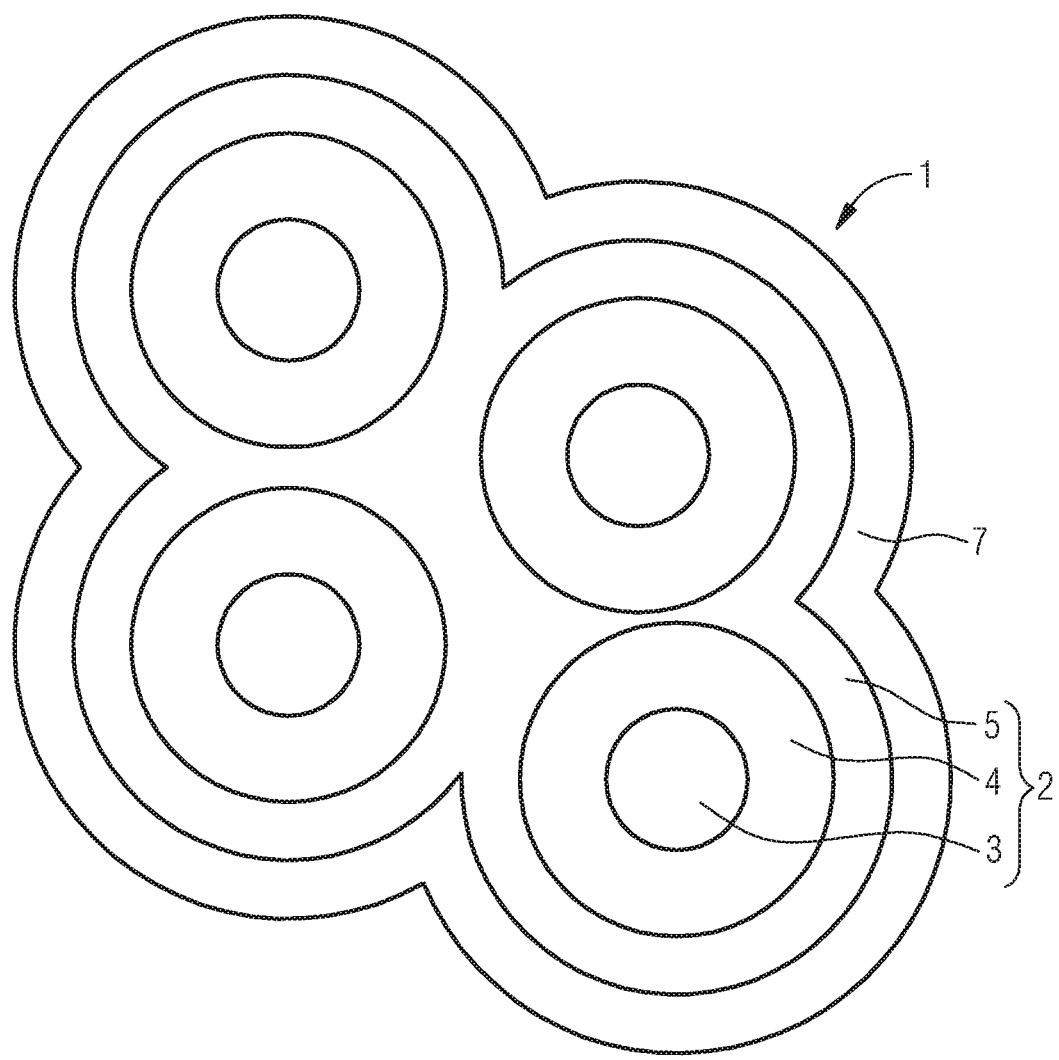

The structure 1 in FIG. 4F comprises a semiconductor structures 2 comprising a plurality of semiconductor nanocrystal 3 surrounded with a first layer 4, aggregated and surrounded with a second layer 5. A high-density oxide layer 7 surrounds the second layer 5 at least partially, preferably completely. In particular, the high-density oxide layer 7 is in direct mechanical contact to the second layer 5.

Figure 5:
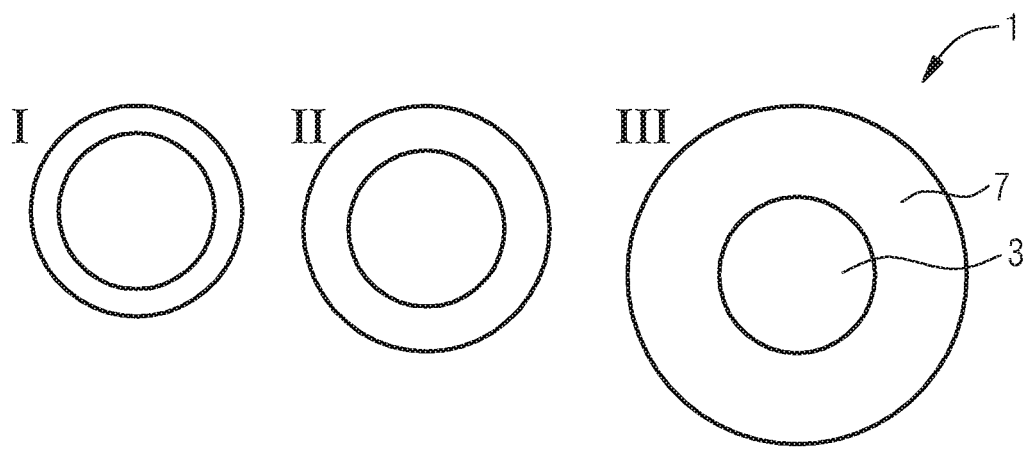

FIGS. 5I-III show schematic illustrations of structures 1 according to FIG. 4A with different thicknesses of the high-density oxide layer 7. For example, the thickness of the high-density oxide layer 7 is about 10 nm, about 25 nm in FIG. 5II, and about 50 nm in FIG. 5III. The thickness of the high-density oxide layer 7 can be approximately in a range of greater than 0 nm to at most 100 nm with a delta of approximately 5 nm.

A layer sizing control can be achieved as follows:

An amount of high-density oxide reagent, for example, a bismuth silicate precursor, is increased at the beginning of the surrounding or shelling reaction, and additional precursors are injected one or more additional times throughout the surrounding or shelling reaction. For example, a syringe pump is used to increase the overall amount of precursors, but dispensing is performed slowly during the reaction time. Upon initiation of growth of a high-density oxide layer, the final size of the layer can be controlled by the amount of precursors and injection method. When growing layers thicker than approximately 30 nm, it can be critical to control the amount and rate of precursors entering into the reaction mixture to avoid forming free high-density oxide particles.

Figure 6:
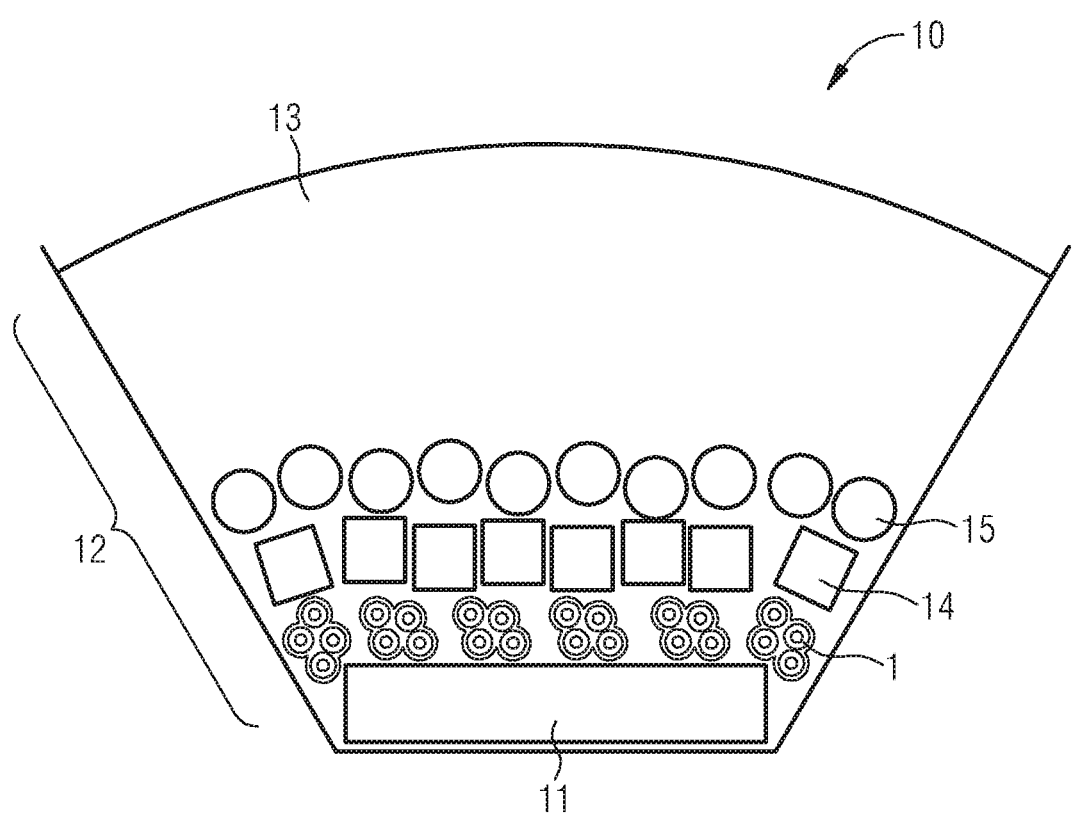
FIG. 6 shows a schematic illustration of an optoelectronic device according to one embodiment.

FIG. 6 shows a schematic illustration of an optoelectronic device 10 with a semiconductor chip 11 with an active layer stack and an active region (not shown here). The semiconductor chip 11 emits a primary radiation during operation of the optoelectronic device 10. In particular, the primary radiation is electromagnetic radiation in the visible wavelength range, preferably in the wavelength range with wavelength greater than 400 nm.

The optoelectronic device 10 further comprises a conversion element 12. The conversion element 12 is configured to convert at least part of the primary radiation into a secondary radiation. The secondary radiation is electromagnetic radiation with a wavelength range at least partially, preferably completely, different than the wavelength range of the primary radiation. For example, the conversion element 12 converts the primary radiation into secondary radiation in the visible wavelength range.

The conversion element 12 comprises at least one structure 1, preferably a plurality of structures 1. The structures 1 are embedded in a matrix material 13 such as silicone, polysiloxane or epoxy. In particular, the structures 1 are arranged in close proximity to the semiconductor chip in the matrix material 13.

The structures 1 can be semiconductor structures 2 bonded to a high-density particle 6 that is a luminescent phosphor particle. In this instance, the structures 1 can be configured to convert primary radiation into radiation of two different wavelength ranges. For example, the semiconductor nanocrystals 3 in the semiconductor structure 2 convert primary radiation into red radiation and the luminescent phosphor particle converts the primary radiation into green radiation. The optoelectronic device 10 can thus emit white light while comprising only one wavelength converting compound.

Alternatively, the structures 1 can be configured to only emit radiation of one wavelength range. For example, semiconductor structures 2 bonded to a high-density particle 6 that is a non-emissive particle or semiconductor structures 2 surrounded with a high-density oxide layer 7 can be used.

The conversion element 12 can comprise further wavelength converting compounds in addition to the structures 1. For example, the conversion element 12 comprises phosphor particles such as red or green phosphors. In particular, the wavelength converting compounds in the conversion element 12 have different energy emissions and thus emits electromagnetic radiation of different wavelength ranges.

The wavelength converting compounds can be arranged in order of their energy emission in the single layer of matrix material 13. In particular, the wavelength converting compound with the lowest energy emission is arranged closest to the semiconductor chip 11. This can be achieved by layering. The reddest emitting wavelength converting compound is located in close vicinity to the semiconductor chip 11 and the bluest emitting wavelength converting compound is located farthest away from the semiconductor chip 11.

As shown in the exemplary embodiment of FIG. 6, the conversion element 12 comprises a single layer of the matrix material 13 and three wavelength converting compounds 1, 14, 15 with different energy emissions arranged in layers in the single layer of matrix material 13. In this instance, the structures 1 are the wavelength converting compound with the reddest emission and thus arranged closest to the semiconductor chip 11. The wavelength converting compound 14 can be a red phosphor with a higher energy emission than the structures 1 and the wavelength converting compound 15 can be a green phosphor with a higher energy emission than the structures 1 and the wavelength converting compound 14. The wavelength converting compound 14 is arranged between the structures 1 and the wavelength converting compound 15.

Such a layering can be achieved by synthesizing structures 1 of maximum density. Additionally, the average density of the wavelength converting compounds 14, 15 can be lowered by functionalizing their surface with alkyl and/or silane chains of different lengths and branching ratios. The three different wavelength converting compounds 1, 14, 15 are added to the same matrix material 13, for example, silicone, and subjected to either thermal or forced sedimentation ultimately leading to the spatial arrangement shown in FIG. 6.

The features and exemplary embodiments described in connection with the figures can be combined with each other according to further exemplary embodiments, even if not all combinations are explicitly described. Furthermore, the exemplary embodiments described in connection with the figures may have alternative or additional features as described in the general part.

The invention is not restricted to the exemplary embodiments by the description on the basis of said exemplary embodiments. Rather, the invention encompasses any new feature and also any combination of features, which in particular comprises any combination of features in the patent claims and any combination of features in the exemplary embodiments, even if this feature or this combination itself is not explicitly specified in the patent claims or exemplary embodiments.

What is claimed is:

1. A structure comprising:
    at least one semiconductor structure comprising at least one semiconductor nanocrystal; and
    a high-density element configured to increase a density of the structure,
    wherein a density of the high-density element is greater than a density of silica, and
    wherein the structure is configured to emit light.

2. The structure according to claim 1, wherein an average density per semiconductor nanocrystal of the structure is higher than an average density per semiconductor nanocrystal of the semiconductor structure without the high-density element.

3. The structure according to claim 1, wherein the at least one semiconductor structure is bonded to a surface of a high-density particle.

4. The structure according to claim 3, wherein the high-density particle is a luminescent phosphor particle or a non-emissive particle.

5. The structure according to claim 3, wherein the at least one semiconductor structure is bonded to the surface of the high-density particle with inorganic linkers, organic linkers or non-covalent linking.

6. The structure according to claim 1, wherein each semiconductor nanocrystal comprises an individual first layer surrounding the semiconductor nanocrystal.

7. The structure according to claim 6, wherein the first layer comprises silica or a high-density oxide.

8. The structure according to claim 6, wherein the first layer comprises at least two regions.

9. The structure according to claim 6, wherein at least two semiconductor nanocrystals each comprising the first layer are aggregated and surrounded by a second layer.

10. The structure according to claim 9, wherein the second layer comprises silica or a high-density oxide.

11. The structure according to claim 9, wherein the second layer comprises a high-density oxide, and wherein a thickness of the second layer is greater than 0 nm and smaller than or equal to 100 nm.

12. The structure according to claim 9, wherein the second layer comprises a high-density oxide, and wherein the second layer is in direct contact to the first layers.

13. The structure according to claim 6, wherein the first layer comprises a high-density oxide, and wherein the first layer is in direct contact to the semiconductor nanocrystals.

14. An optoelectronic device comprising:
a semiconductor chip configured to emit a primary radiation; and
a conversion element configured to convert at least part of the primary radiation into a secondary radiation, wherein the conversion element comprises at least one structure according to claim 1.

15. The optoelectronic device according to claim 14, wherein the conversion element comprises a single layer of matrix material and at least two wavelength converting compounds with different energy emissions arranged in layers in the single layer of matrix material, wherein the wavelength converting compounds are arranged in order of their energy emission, wherein the wavelength converting compound with a lowest energy emission is arranged closest to the semiconductor chip, and wherein at least one of the wavelength converting compounds comprises the structure.

16. The optoelectronic device according to claim 14, wherein the conversion element comprises a single layer of matrix material, a plurality of structures in the single layer of matrix material, a green phosphor in the single layer of matrix material and a red phosphor in the single layer of matrix material, and wherein the plurality of structures is arranged adjacent to the semiconductor chip, the red phosphor is arranged adjacent to the plurality of structures and the green phosphor is arranged adjacent to the red phosphor.

17. The optoelectronic device according to claim 14, wherein the structure comprises semiconductor structures bonded to a surface of a high-density particle, and wherein the high-density particle is a luminescent phosphor particle.

* * * * *

UNITED STATES PATENT AND TRADEMARK OFFICE
CERTIFICATE OF CORRECTION

PATENT NO. : 11,508,880 B2
APPLICATION NO. : 16/822398
DATED : November 22, 2022
INVENTOR(S) : Joseph Treadway et al.

It is certified that error appears in the above-identified patent and that said Letters Patent is hereby corrected as shown below:

On the Title Page

Item (73) Assignee; delete "TDK ELECTRONICS AG, Munich (DE)" and insert --OSRAM Opto Semiconductors GmbH, Regensburg (DE)--.

Signed and Sealed this
Sixteenth Day of July, 2024

Katherine Kelly Vidal
*Director of the United States Patent and Trademark Office*